United States Patent [19]
Dowben

[11] Patent Number: 6,025,611
[45] Date of Patent: Feb. 15, 2000

[54] BORON-CARBIDE AND BORON RICH RHOBOHEDRAL BASED TRANSISTORS AND TUNNEL DIODES

[75] Inventor: Peter A. Dowben, Crete, Nebr.

[73] Assignee: The Board of Regents of the University of Nebraska, Lincoln, Nebr.

[21] Appl. No.: 08/933,962

[22] Filed: Sep. 19, 1997

Related U.S. Application Data

[60] Provisional application No. 60/026,972, Sep. 20, 1996.

[51] Int. Cl.$^7$ .................................................. H01L 31/0328
[52] U.S. Cl. ............................ 257/183; 257/200; 257/201
[58] Field of Search ..................................... 257/183, 200, 257/201

[56] References Cited

U.S. PATENT DOCUMENTS

| | | | |
|---|---|---|---|
| 3,224,913 | 12/1965 | Ruehrwein | 148/175 |
| 3,364,084 | 1/1968 | Ruehrwein | 148/175 |
| 3,565,703 | 2/1971 | Kamath | 148/172 |
| 4,348,428 | 9/1982 | Rockley | 427/54.1 |
| 4,362,766 | 12/1982 | Dannhäuser et al. | 427/39 |
| 4,569,855 | 2/1986 | Matsuda et al. | 427/35 |
| 4,766,482 | 8/1988 | Smeltzer et al. | 357/23.7 |
| 4,957,773 | 9/1990 | Spencer et al. | 427/39 |
| 5,030,583 | 7/1991 | Beetz, Jr. | 437/39 |
| 5,061,322 | 10/1991 | Asano | 136/258 |
| 5,070,027 | 12/1991 | Mito et al. | 437/15 |
| 5,468,978 | 11/1995 | Dowben | 257/258 |
| 5,632,669 | 5/1997 | Azarian et al. | 451/54 |
| 5,750,231 | 5/1998 | Ahlert et al. | 428/65.5 |

OTHER PUBLICATIONS

Boag et al., "Designing of organometallics for vapor phase metallization of plastics," *Metallized Plastics 4: Fundamental and Applied Aspects*, (Mittal, Ed.) Plenum Press: New York, pp. 1–7 (1996).

Byun et al., Heterojunction fabrication by selective area chemical vapor deposition induced by synchrotron radiation, *Appl. Phys. Lett.*, vol. 64, pp. 1968–1970 (1994).

Byun et al., "Synchrotron radiation induced decomposition of closo–1,2–dicarbadodecaborane," *Jpn. J. Appl. Phys.*, vol. 34, Part 2, No. 7B, pp. L941–L944 (1995).

Byun et al., "Comparison of different chemical vapor deposition methodologies for the fabrication of heterojunction boron–carbide diodes," *Nanostructured Materials*, vol. 5, pp. 465–471 (1995).

Callahan et al., "Ten years of Metallocarboranes," *Adv. Organometallic Chem.*, vol. 14, pp. 145–186 (1976).

Carpinelli et al., "Scanning tunneling microscopy study of intermediates in the dissociative adsorption of closo–1, 2–dicarbadodecaborane on Si(111)," *J. Vacuum Sci. & Tech. B*, vol. 13(3), pp. 1203–1206 (1995).

(List continued on next page.)

*Primary Examiner*—David B. Hardy
*Assistant Examiner*—Huy Bui
*Attorney, Agent, or Firm*—Suiter & Associates PC

[57] ABSTRACT

The present invention relates to the fabrication of a boron carbide/boron diode on an aluminum substrate, and a boron carbide/boron junction field effect transistor. Our results suggest that with respect to the approximately 2 eV band gap pure boron material, 0.9 eV band gap boron carbide ($B_5C$) acts as a p-type material. Both boron and boron carbide ($B_5C$) thin films were fabricated from single source borane cage molecules using plasma enhanced chemical vapor deposition (PECVD). Epitaxial growth does not appear to be a requirement. We have doped boron carbide grown by plasma enhanced chemical vapor deposition. The source gas closo-1,2-dicarbadecaborane (orthocarborane) was used to grow the boron carbide while nickelocene ($Ni(C_5H_5)2$) was used to introduce nickel into the growing film. The doping of nickel transformed a $B_5C$ material p-type relative to lightly doped n-type silicon to an n-type material. Both p-n heterojunction diodes and n-p heterojunction diodes with n- and p-type Si [1,1,1] respectively. With sufficient partial pressures of nickelocene in the plasma reactor diodes with characteristic tunnel diode behavior can be successfully fabricated.

19 Claims, 8 Drawing Sheets

OTHER PUBLICATIONS

Cava et al., "Stabilization of superconducting $LnPt_2B_2C$ by partial substitution of gold for platimun," *Physica C,* vol. 226, pp. 170–174 (1994).

Cava et al., "Superconductivity in the quaternary intermetallic compounds $LnNi_2B_2C$," *Nature,* vol. 367, pp. 252–253 (1994).

Chauvet et al., "Spin susceptability of boron carbides: dissociation of singlet small bipolarons," *Phys. Rev. B,* vol. 53(21), pp. 14450–14457 (1996).

Chynoweth et al., "Excess tunnel current in silicon Esaki junctions," *Phys. Rev.,* vol. 121, pp. 684–694 (1961).

Claassen, "Excess and hump current in Esaki diodes," *J. Appl. Phys.,* vol. 32, pp. 2372–2378 (1961).

Dowben et al., "Nickel doping of boron carbide and Fermi level shifts," pp. 1–6, unpublished manuscript.

Epstein et al., "Lithium–doped gallium arsenide tunnel diodes," *J. Appl. Phys.,* vol. 35, pp. 3050–3051 (1964).

Hawthorne et al. "π–Dicarbollyl derivatives of the transition metals. Metallocene analogs," *J. Am. Chem. Soc.,* vol. 90, pp. 879–896 (1968).

Hitchcock et al., "Inner–shell excitation of boranes and carboranes," *J. Phys. Chem.,* vol. 97, pp. 8171–8181 (1993).

Hitchcock et al., "Inner–shell excitation spectroscopy of closo–carboranes," *J. Phys. Chem. B,* vol. 101, pp. 3483–3493 (1997).

Hwang et al., "Fabrication of boron–carbide/boron heterojunction devices," *Appl. Phys. Lett.,* vol. 68(11), pp. 1495–1497 (1996).

Hwang et al., "Nickel doping of boron carbide grown by plasma enhanced chemical vapor deposition," *J. Vacuum Sci. & Tech. B,* vol. 14(4), pp. 2957–2960 (1996).

Hwang et al., "Phosphorus doping of boron carbon alloys," Mat. Res. Soc. Symp. Proc., vol. 452, pp. 1031–1036 (1997).

Hwang et al., "Fabrication of n–type nickel doped $B_5C_{1+\delta}$ homojunction and heterojunction diodes," *Appl. Phys. Lett.,* vol. 70(8), pp. 1028–1030 (1997).

Kane, "Theory of tunneling," *J. Appl. Phys.,* vol. 32, pp. 83–91 (1961).

Karlovsky, "The curvature coefficient of germanium tunnel and backward diodes," *Solid State Electron,* vol. 10, pp. 1109–1111 (1967).

Kim et al., "Chemical vapor deposition of bron and boron nitride from decaborane(14)," *J. Vacuum Sci. & Tech. A,* vol. 7(4), pp. 2796–2799 (1989).

Kim et al., "Fabricating magnetic Co–Ni–C thin–film alloys by organometallic chemical vapor deposition," *J. Appl. Phys.,* vol. 70, pp. 6062–6064 (1991).

Kobayashi et al., "Thermal and ion beam induced reactions in Ni thin films on BP(100)," *Appl. Phys. Lett.,* vol. 54, pp. 1914–1915 (1989).

Kobayashi et al., "Thermal and ion beam induced reactions in Ni on BP," Mater. Res. Sympp. Proc., vol. 162, pp. 595–600 (1990).

Kuhlmann et al., IR optical properties of Fe–doped β–rhombohedral boron, AIP Conf. Proc., vol. 231 (Boron–Rich Solids), pp. 340–343 (1991).

Kuhlmann et al., Influence of interstitially soluted iron on structural, optical and electrical properties of β–rhombohedral boron, *J. Alloys and Compounds,* vol. 186, pp. 187–200 (1992).

Kuhlmann et al., "Ionization of interstitial iron atoms in β–rhombohedral boron," *Phys. Stat. Sol.,* vol. 187, pp. 43–59 (1995).

Lee et al., "Characterization of boron carbide thin films fabricated by plasma enhanced chemical vapor deposition from boranes," *J. Appl. Phys.,* vol. 72(10), pp. 4925–4933 (1992).

Lee et al., "Conductance in microcrystalline $B_{1-x}C_x$/Si heterojunction diodes," Mater. Res. Soc. Symp. Proc., vol. 283, pp. 483–488 (1993).

Lee et al., "The structural homogeneity of boron carbide thin films fabricated using plasma–enhanced chemical vapor deposition from $B_5H_9+CH_4$," *J. Appl. Phys.,* vol. 74(11), pp. 6919–6924 (1993).

Lee et al., "The properties of boron carbide/silicon heterojunction diodes fabricated by plasma–enhanced chemical vapor deposition," *J. Appl. Phys.,* vol. A58, pp. 223–227 (1994).

Lewis et al., "Chemical vapor deposition of boron–carbon films using organometallic reagents," *Mat. Lett.,* vol. 27, pp. 327–332 (1996).

Logan et al., "Effect of degenerate semiconductor band structure on current–voltage characteristics of silicon tunnel diodes," *Phys. Rev.,* vol. 131, pp. 89–95 (1963).

Lund et al., "Boron phosphide on silicon for radiation detectors," Mat. Sci. Soc. Sympp. Proc., vol. 162, pp. 601–604 (1990).

McIlroy et al., "The coadsorption of metals and molecular icosahedra on Cu(100)," *Surface Science,* vol. 328, pp. 47–57 (1995).

McIlroy et al., "Band gaps of doped and undoped films of molecular icosahedra," *Mat. Sci. Eng.,* vol. A217/218, pp. 64–68 (1996).

McIlroy et al., "The incorporation of nickel and phosphorus dopants into boron–carbon alloy thin films," *Applied Physics A,* vol. 67, pp. 335–342 (1998).

Mazurowski et al., "Novel methods for deposition of boron carbide films," in Plasma Processing and Synthesis of Materials, MRS Symposium Proceedings, (Apelian et al., Eds.) MRS: Pittsburgh, PA, vol. 190, pp. 101–106. (1991).

Mazurowski et al., "Characterization of boron carbide films formed by PECVD," in Wide Band Gap Semiconductors, MRS Symposium Proceedings, (Moustakas et al., Eds.) MRS: Pittsburgh, PA, vol. 242, pp. 637–642 (1992).

Meyerhofer et al., "Degenerate germanium. I. Tunnel, excess, and thermal current in tunnel diodes," *Phys. Rev.,* vol. 126, pp. 1329–1341 (1962).

Minton et al., "Theoretical and experimental analysis of germanium tunnel diode characteristics," *Solid State Electron,* vol. 7, pp. 491–500 (1964).

Nagarajan et al., "Bulk superconductivity at an elevated temperature ($T_c \approx 12$ K) in a nickel containing alloy system Y–Ni–B–C," *Phys. Rev. Lett.,* vol. 72, pp. 274–277 (1994).

Perkins et al., "Synchrotron–radiation–induced deposition of boron and boron carbide films from boranes and carboranes: decaborane," *J. Appl. Phys.,* vol. 69, pp. 4103–4109 (1991).

Perkins et al., "Demonstrating the utility of boron based precursor molecules for selective area deposition in a scanning tunnelling microscope," Mat. Res. Soc. Symp. Proc., vol. 236, pp. 153–158 (1992).

Perkins et al., "Synchrotron–radiation–induced deposition of boron and boron carbide films from boranes and carboranes II: nido–2,3–diethyl–2,3–dicarbahexaborane," *Applied Physics A,* vol. 54, pp. 442–450 (1992).

Rosenberg et al., "Selective area deposition of boron on Si(111) induced by synchrotron radiation," *Appl. Phys. Lett.,* vol. 58(11), pp. 607–609 (1991).

Rosenberg et al., "Selective area, synchrotron radiation induced. delta doping of silicon," *J. Appl. Phys.,* vol. 71(10), pp. 4795–4798 (1992).

Shiomi et al., "High–voltage schottky diodes on boron–doped diamond epitaxial films," *Japanese Journal of Applied Physics,* vol. 29(12), pp. L2163–L2164 (1990).

Siegrist et al., "The crystal structure of superconducting $LuNi_2B_2C$ and the related phase LuNiC," *Nature,* vol. 367(20), pp. 254–256 (1994).

Stauf et al., "Iron and nickel thin film deposition via metallocene decomposition," *Thin Solid Films,* vol. 153, pp. 421–430 (1987).

Stauf et al., "Patterned photoassisted organometallic deposition of iron, nickel and palladium on silicon," *Thin Solid Films,* vol. 156, pp. L31–L36 (1988).

Thornber et al., "The tunnelling time of an electron," *J. Appl. Phys.,* vol. 38(5), pp. 2384–2385 (1967).

Warren et al., "Metallocene analogs of copper, gold, and palladium derived from the (3)–1,2–dicarbollide ion," *J. Am. Chem. Soc.,* vol. 90(18), pp. 4823–4828 (1968).

Warren et al., "The chemistry of the bis[π–(3)–1,2–dicarbollyl] metallates of nickel and palladium," *J. Am. Chem. Soc.,* vol. 92(5), pp. 1157–1173 (1970).

Werheit et al., "Structural and electronic properties of carbon doped β–rhombohedral boron," *Phys. Stat. Sol. (b),* vol. 179, pp. 489–511 (1993).

Werheit et al., "Solid solutions of silicon in boron–carbide–type crystals," *J. of Alloys and Compounds,* vol. 209, pp. 181–187 (1994).

Werheit, "Boron–rich solids: a chance for high–efficiency high–temperature theromelectric energy conversion," *Mat. Sci. Soc. Eng.,* vol. B29, pp. 228–232 (1995).

Widder et al., "Dielectric function of $YNi_2B_2C$ between 10 meV and 50 eV," *Europhys. Lett.,* vol. 30(1), pp. 55–60 (1995).

Zych et al., "Novel methos fir the fabrication of ferromagnetic nickel and nickel boride thin films," *J. Appl. Phys.,* vol. 76(6), pp. 3684–3687 (1994).

BORON-CARBIDE AND BORON RICH RHOBOHEDRAL BASED TRANSISTORS AND TUNNEL DIODES

CROSS-REFERENCE TO RELATED APPLICATIONS

This application claims priority under 35 U.S.C. §119(e) based on Provisional Application No. 60/026,972, filed Sep. 20, 1996.

This work resulted in part from research conducted under U.S. Air Force grant AFOSR F49620-94-1-0433. The government has certain rights in this invention.

BACKGROUND OF THE INVENTION

The present invention relates to a process for the deposition of boron carbide semiconductor material, and also to semiconductor devices formed by deposition of a boron carbide film. The invention is more particularly directed to a technique for creating a layer of boron carbide with a boron-to-carbon ratio of about 5. The invention is also particularly directed to heterojunction semiconductor devices produced by this technique.

Boron and boron carbide devices have been sought since 1959 [1] but only recently has the fabrication of these devices been realized [2, 3]. Such devices would have applicability in a wide number of harsh conditions. For example, they should be resistant to corrosive, high temperature, and mechanically abrasive environments. Because of the large neutron capture cross-section, these materials could be used in devices in radioactive environments as well [4].

Techniques are known for forming boron-rich carbides. These techniques may employ alkanes and heavy boron cage molecules to deposit boron carbide thin films. Plasma-enhanced chemical vapor deposition (PECVD) can be employed to fabricate boron carbide films without resort to high temperatures or high pressures. These technique typically employ a halide of boron, e.g., $BCl_3$, $BBr_3$ or $BI_3$. Most recently boranes, such as nido-decaborane and nido-pentaborane have gained interest, because these compounds are safe and stable, yet produce a vapor pressure of several Torr at room temperature. However, until very recently, only low-resistivity boron carbide materials could be produced, i.e., materials with resistivities on the order of about ten ohm-cm at room temperature. Boron carbide material of this type has an extremely low band gap, and is not suited as a semiconductor material.

At the same time, boron carbide has become an attractive material because of its inherent hardness and durability. Boron carbide, like other boron-containing materials, has been considered for high temperature electronic devices because it retains its useful characteristics at elevated temperatures. For example, boron carbide is known to have a melting temperature of 2350° C., a strength of 50 ksi, a hardness of 2800 $kg/mm^2$, and a thermal conductivity of 0.22 cal/cm/sec/° C./cm. Diamond and silicon carbide have been investigated because of their good thermal and mechanical characteristics, and because of their wide band gaps. However, these materials have not yet proven cost effective.

Recent successes in construction of boron carbide/n-Si [1,1,1] heterojunction diodes [5, 6] have demonstrated that boron carbide/Si [1,1,1] heterojunction diodes can be fabricated from closo-1,2-dicarbadodecaborane ($C_2B_{10}H_{12}$; orthocarborane) by using synchrotron radiation induced chemical vapor deposition (SR-CVD) [5, 6], and plasma enhanced chemical vapor deposition (PECVD) [2, 3, 5-7]. Pure boron films also had been deposited on silicon from nido-decaborane ($B_{10}H_{14}$; decaborane) by using SR-CVD [8, 9]. Boron carbide/n-Si [1,1,1] heterojunction devices fabricated by depositing boron carbide from nido-pentaborane and alkanes using PECVD is shown and described in U.S. Pat. No. 5,468,978, hereby incorporated by reference in its entirety.

SUMMARY OF THE INVENTION

It is an object of the present invention to provide cost-effective boron/boron carbide heterojunction devices and techniques to fabricate same.

It is another object of the present invention to provide a semiconductor device suited for use in high temperature, corrosive, mechanically abrasive, or radioactive environments.

Another object of the present invention is to provide a boron carbide semiconductor device and fabrication technique which does not require a silicon interface.

Yet another object of the present invention is to provide a boron carbide semiconductor device and fabrication technique to fabricate same which do not depend on epitaxial growth or crystallite size.

Still another object of the present invention is to provide a nickel doped boron carbide heterojunction device and fabrication technique whereby the doped boron carbide appears as n-type relative to an n-type silicon substrate.

The objects of the present invention are provided by the boron/$B_5C$ heterojunction devices and the nickel doped boron carbide/silicon heterojunction devices and fabrication techniques as disclosed herein.

The fabrication of several working boron/$B_5C$ heterojunction devices is described herein. In an effort to fabricate a more sophisticated device, a transistor was made in our PECVD system. A diode was made directly on an aluminum substrate to demonstrate that a silicon interface is not essential for fabrication of a boron carbide device. The use of plasma enhanced chemical vapor deposition (PECVD) provides a means for fabricating boron and boron carbide thin films successfully in a high resistivity form [2, 3]. This work addresses some of the issues associated with making devices of increasing complexity from boron carbide.

The aluminum substrates were polycrystalline, and the silicon substrates were [1,1,1], n-type. Both were chemically etched and cleaned prior to insertion in vacuo and set on the lower electrode. The substrates were further cleaned by Ar+ bombardment at 300 mTorr, 40 W and annealed at 400° C. in the vacuum system. Deposition was carried out in a custom designed parallel plate 13.56 MHZ radiofrequency plasma enhanced chemical vapor deposition (PECVD) reactor described previously [3, 7]. A suitable plasma chamber in which this technique can be carried out is shown and described in U.S. Pat. No. 4,957,773, hereby incorporated by reference in its entirety.

The above, and many other objects and advantages of the present invention will become apparent from the ensuing detailed description of the invention, to be read in conjunction with the accompanying drawings.

DETAILED DESCRIPTION OF THE INVENTION

Figure 1A:
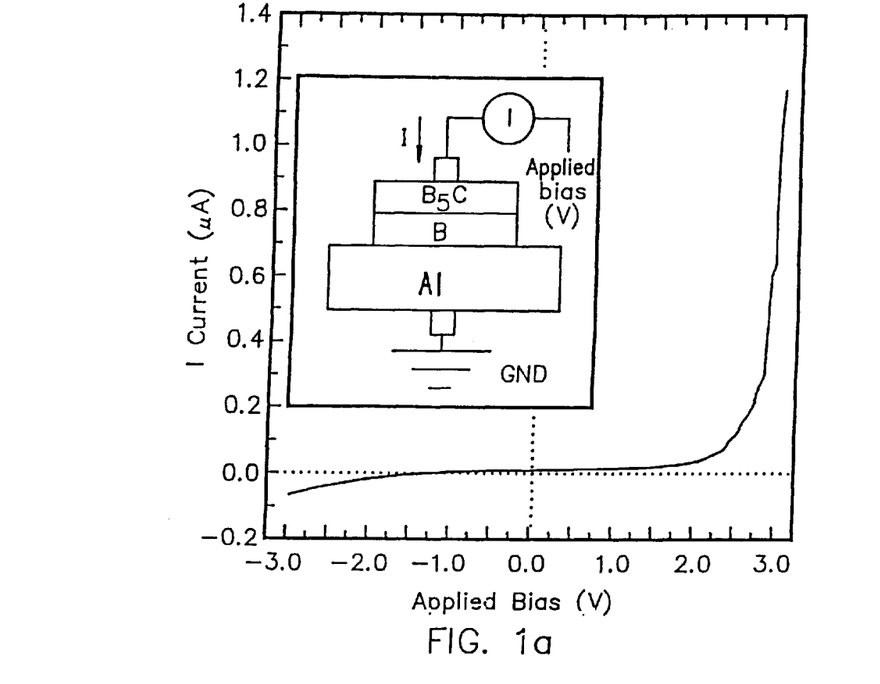
FIG. 1a is a graph of diode I–V characteristics of a boron carbide/boron/aluminum device according to the present invention with a schematic cross sectional view of the diode structure and wire connections for characteristics shown in the insert.

Using our established CVD sources, boron carbide/boron multilayers were deposited on aluminum and silicon. FIG. 1a shows the schematic cross-sectional view of the fabricated multilayer devices. Decaborane was used to form a pure boron film on the substrates. Boron carbide ($B_5C$) films were then deposited on the pure boron layer from orthocarborane. The purity of the orthocarborane and decaborane was determined by infrared (IR), nuclear magnetic resonance (NMR) and mass spectral measurements (purity 98%) and compared with literature values [10]. Less than 1% of the metacarborane and paracarborane isomers were found to be present. The decaborane was sublimed to separate the source material from cellite (a stabilizer) and other impurities [10].

Figure 1B:
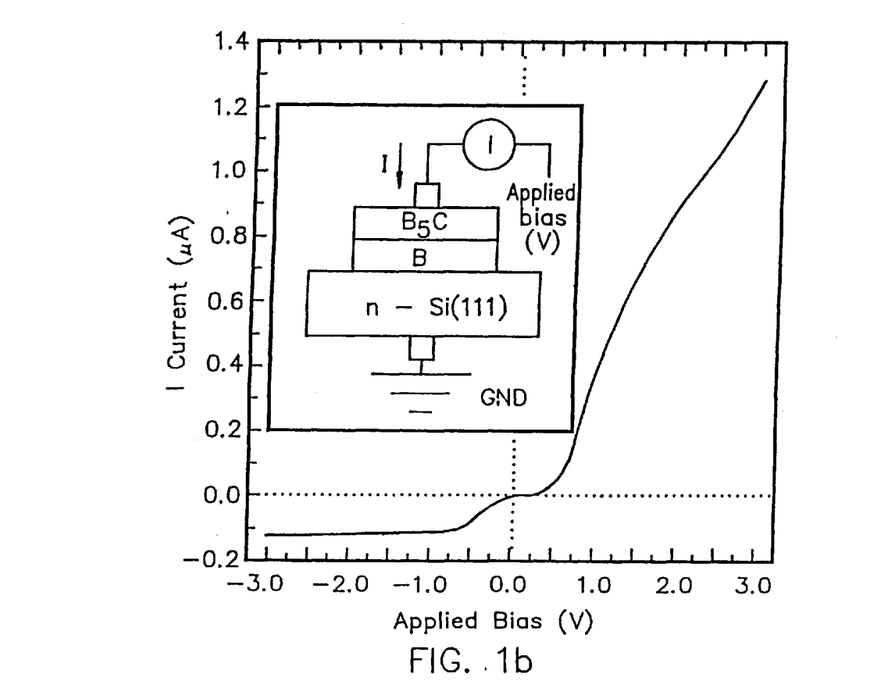
FIG. 1b is a graph of diode I–V characteristics of a boron carbide/boron/n-Si [1,1,1] device according to the present invention with a schematic cross-sectional view of the diode structure and electrical wire connections for characteristics shown in the inset.

The diode I–V characteristics of a $B_5C$/boron/aluminum structure are seen in FIG. 1a. Although not shown here, a boron/aluminum structure exhibits an ohmic characteristic, which leads to the conclusion that a junction exists between the $B_5C$ and boron with the $B_5C$ acting as the p-type material. The I–V diode characteristics of a $B_5C$/boron/n-type silicon structure are seen in FIG. 1b. In this case the boron/n-type silicon structure, which is not shown, exhibits a diode characteristic with the boron acting as a p-layer with respect to the n-type silicon. This result, combined with results of FIG. 1a and the boron/aluminum structure indicate the $B_5C$/boron/n-type silicon structure consists of two diodes in series oriented in the same direction. This is borne out by the observed diode curve in FIG. 1b. Furthermore, neither structure exhibits the classical exponential diode behavior in the forward direction. This type of behavior is similar to the previously reported boron carbide/n-type Si [1,1,1] heterojunction [2, 3]. We have demonstrated that boron carbide thin film on n-type Si [1,1,1] heterojunction diodes are insensitive to the morphology of the film [6]. The semiconductor properties of the material do not appear to depend upon crystallite size and the extent of long range order, and similar material can be grown on other substrates such as silver and Si [1,1,1].

Figure 2A:
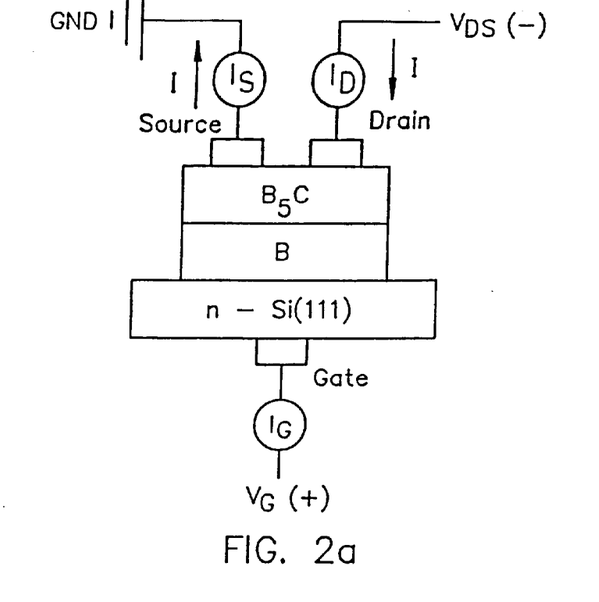
FIG. 2a shows the schematic cross-sectional geometry of fabricated boron carbide junction field-effect transistor [JFET] according to the present invention. The schematic also illustrates electrical wire connections as well as polarities of each applied biases.
Figure 2B:
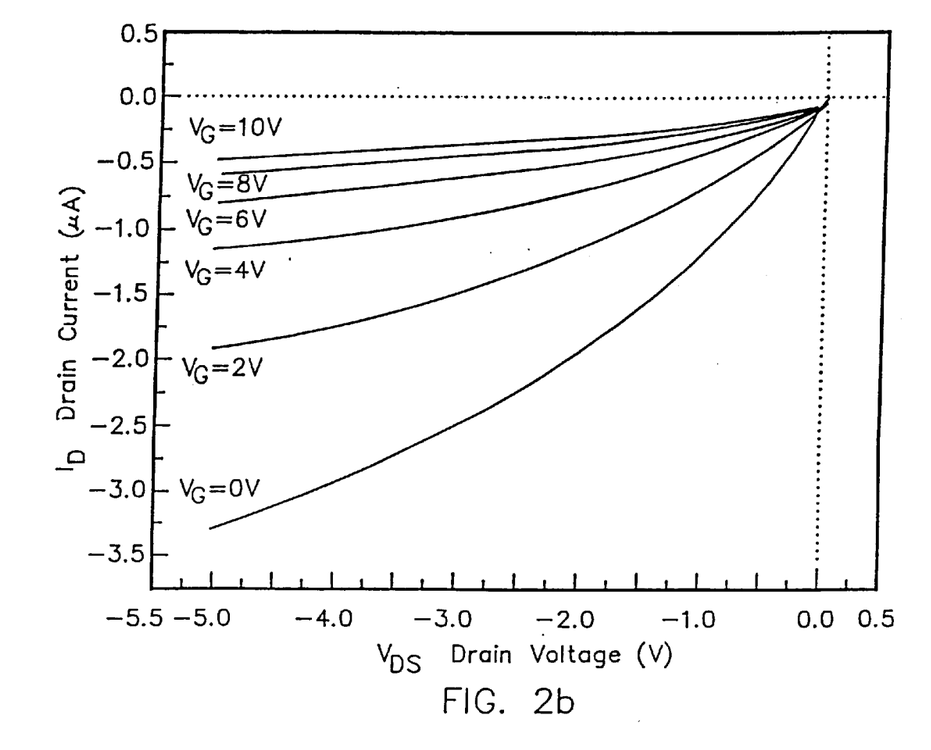
FIG. 2b shows transistor characteristics of $I_D$ (drain current) vs. $V_{DS}$ for the device shown in FIG. 2a. Gate voltage, $V_G$, was applied from 0 V to 10 V by the step of 2 V.

The fabricated boron carbide/boron/silicon multilayer device can be employed as a junction field effect transistor (JFET). FIG. 2a shows the schematic diagram of the measurement circuit, while FIG. 2b shows the drain current vs. drain voltage, with the source at ground, as a function of the gate voltage. Based on the characteristics of FIG. 1b, the gate is biased positive, while the drain is swept through negative voltages, each with respect to the grounded source. As the gate voltage is increased, the magnitude of the drain current decreases for any given value of drain voltage, which is the expected behavior for a JFET. It should be pointed out that the device does not saturate, nor does it completely cut off. This is probably a result of the fact that this is a single junction device, and the junction is relatively far removed from the source and drain region.

Figure 3:
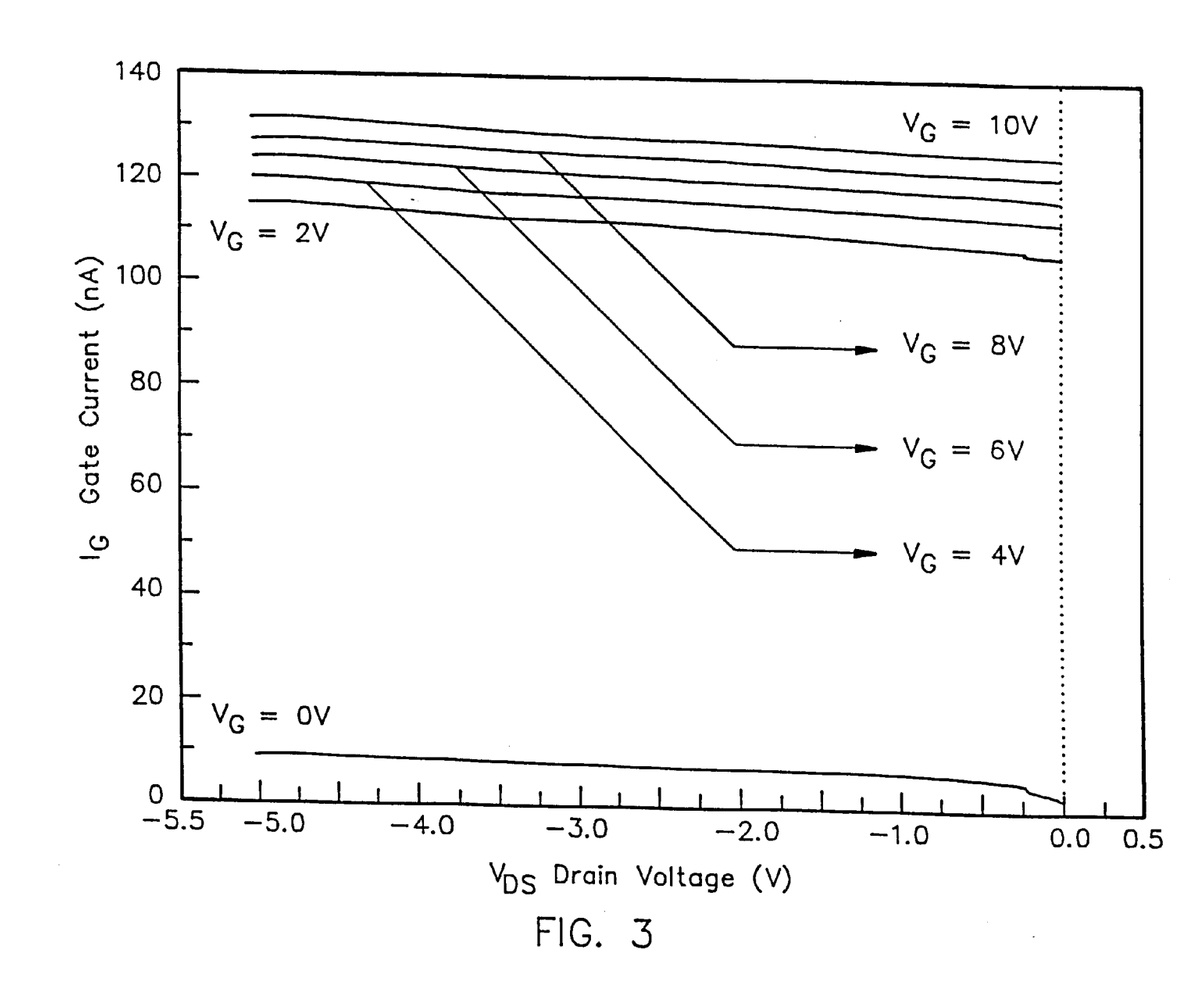
FIG. 3 shows the transistor characteristics of $I_G$ (gate current) vs. $V_{DS}$ for the device shown in FIG. 2a. Note that, relative to FIG. 2, the currents are small.

FIG. 3 is the gate current vs. drain voltage as a function of gate voltage. When combined with FIG. 2b, this clearly indicates the leakage current is less than 10% of the drain current.

We have already compared diodes fabricated from boron carbide with crystallites of different sizes (30 Å, 100 Å and 240–340 Å) [6]. While the ideality factors of these diodes do differ, similar rectifying diodes were fabricated [6] to the ones shown in this work. We believe that this insensitivity to crystal grain size and the clear evidence that devices can be fabricated on very different substrates provides some evidence that epitaxial growth is not a determining issue in the fabrication of devices made with this microcrystalline or polycrystalline semiconductor material.

The fabrication of heterojunction devices from plasma enhanced [11–14] and synchrotron radiation [14, 15] chemical vapor deposition is possible from decomposition of cluster borane molecules. In fact, not only have diodes been fabricated, but a field effect transistor as well [13]. Nonetheless, no intentional doping of this material grown by plasma enhanced chemical vapor deposition (PECVD) has been attempted successfully prior to this work.

Attempts to dope films of the molecular icosahedra closo-1,2-dicarbadodecaborane (orthocarborane) have not been uniformly successful. Such molecular films can be doped with sodium [16, 17], but not the more common dopant mercury [16]. Since the suitability of orthocarborane ($C_2B_{10}H_{12}$) for the chemical vapor deposition of a $B_5C$ film suitable for making devices has been established [13, 15], these results suggest that doping of this material may be a complex process.

Nonetheless, nickel is a very promising dopant for the boron rich solids. A molecular nickel carborane complex has been synthesized by inorganic chemists [18] and the inclusion of nickel in other boron rich solids is well established.

Nickel is a common component in the boron carbide superconductors [19] and the reactions of nickel with boron phosphide have been investigated [20, 21]. Nickelocene, Ni($C_5H_5$)$_2$ has been shown to be a suitable source compound for the deposition of nickel containing thin films [22]. Nickelocene is volatile and far less toxic than nickel carbonyl, though a number of other nickel containing organometallic compounds may be suitable [23]. Since both orthocarborane and nickelocene are easily sublimed from the solid, introduction of suitable mixtures into the plasma reactor can be readily accomplished.

The p-n and n-p heterojunctions were formed by depositing boron carbide thin films on n-type and p-type Si [1,1,1] substrates respectively, doped to $7 \times 10^{14}/cm^3$, following procedures described in detail elsewhere [11, 12]. The Si [1,1,1] substrates surfaces were prepared by $Ar^+$ ion sputtering in the plasma reactor. Deposition of the films was performed in a custom designed parallel plate 13.56 MHZ radio-frequency PECVD reactor used in previous studies [11–12]. The source molecule gas closo-1,2-dicarbadecaborane (ortho-carborane) was used to grow the boron carbide while nickelocene (Ni($C_5H_5$)$_2$) was used to introduce nickel into the growing film.

Figure 4A:
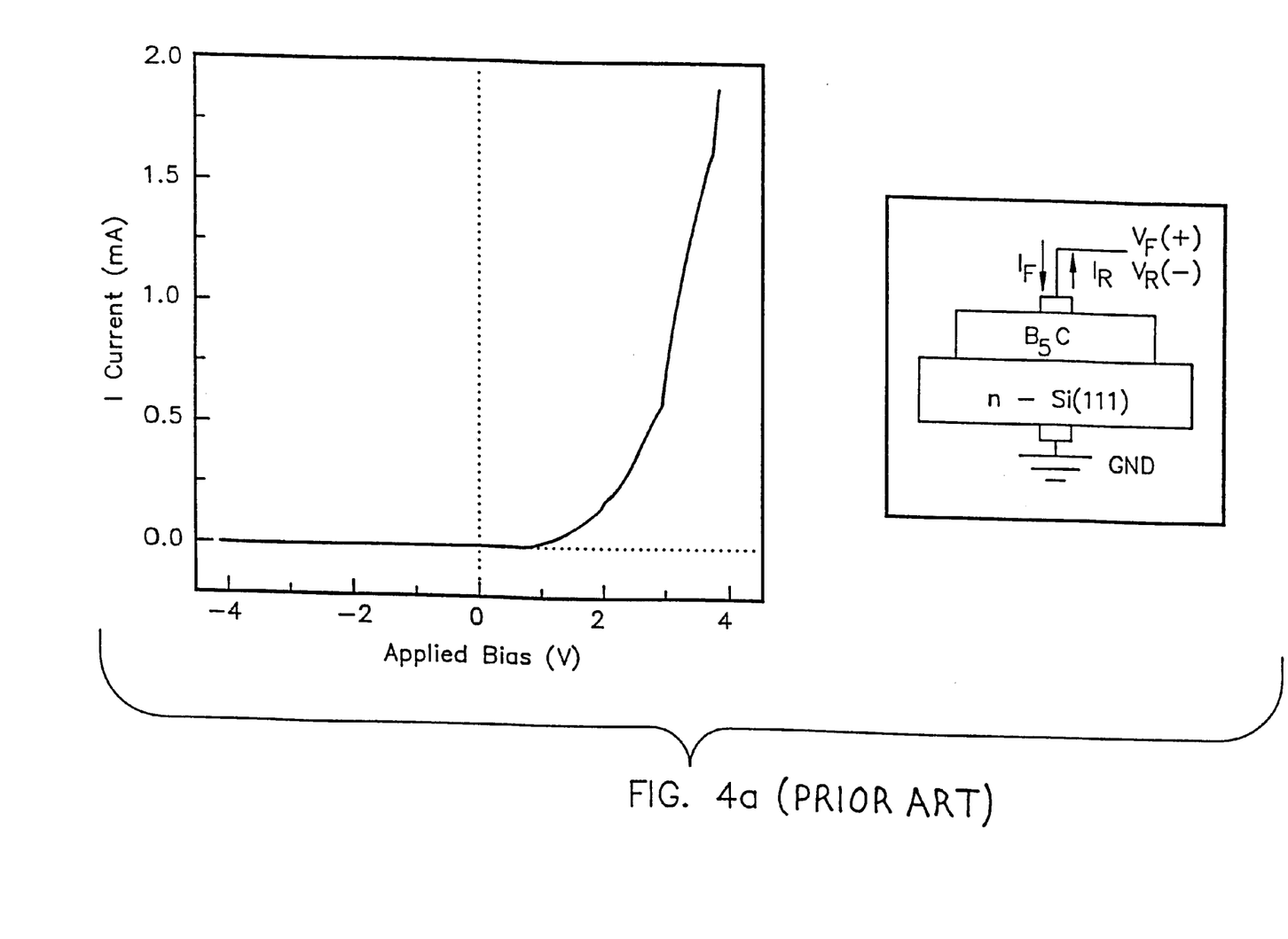
FIG. 4a shows the schematic cross-sectional geometry of a boron carbide/n-Si [1,1,1] heterojunction and a graph of diode I–V characteristics for the device shown.
Figure 4B:
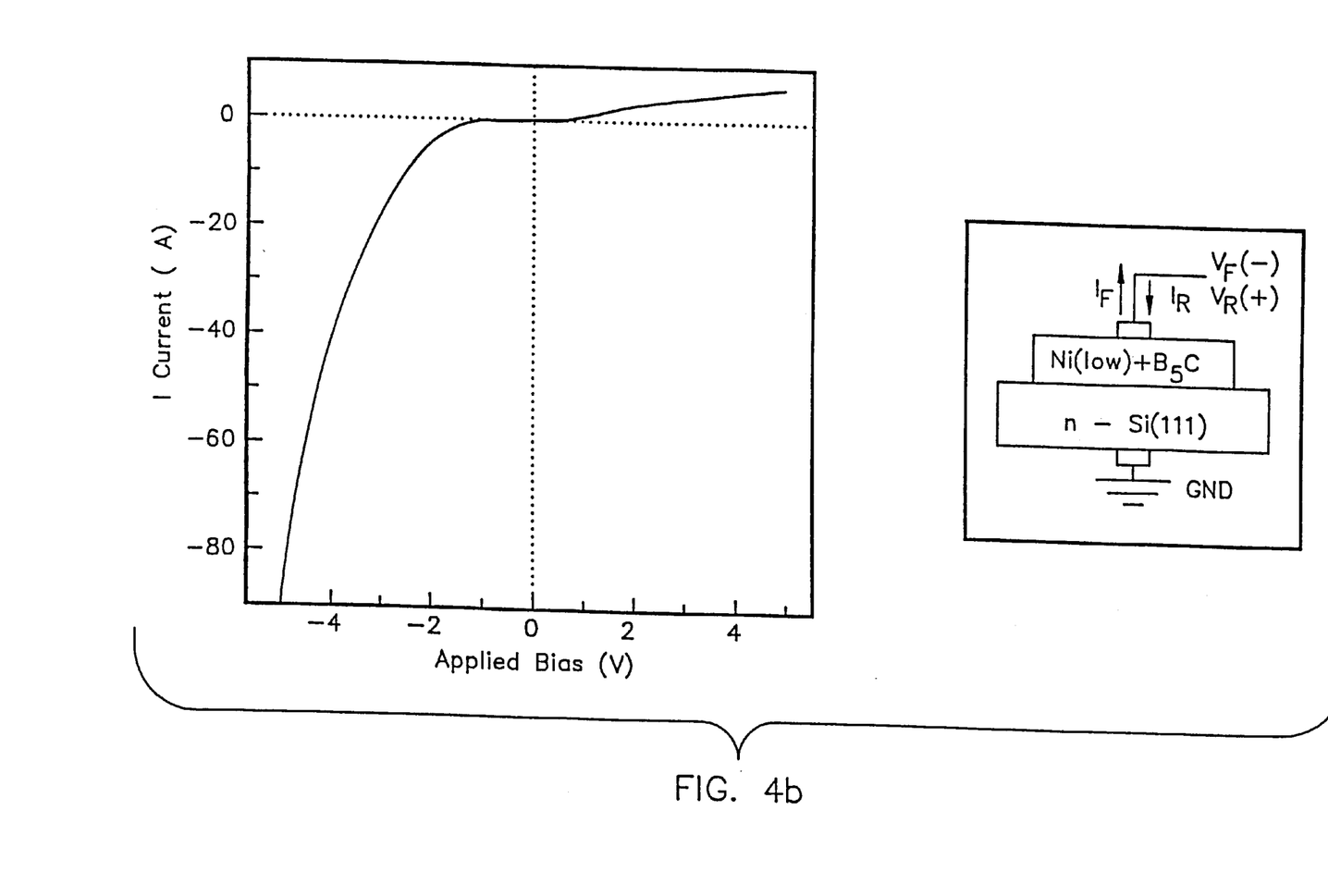
FIG. 4b shows the schematic cross-sectional geometry of the high nickel doped boron carbide/n-Si [1,1,1] heterojunction according to the present invention and a graph of diode I–V characteristics for the device shown.

Typical $B_5C$/n-type silicon heterojunctions have been routinely formed by this technique [11–14] as seen in FIG. 4a. With inclusion of nickelocene as an addition source gas, nickel was included in the growing boron carbide thin film. The presence of nickel at high doping levels was established by Auger electron spectroscopy employing a cylindrical mirror analyzer (Perkin Elmer double pass CMA) as the electron energy analyzer. Several different partial pressures of nickelocene were employed. Low relative partial pressures of nickelocene to during film growth orthocarborane (<0.1) resulted in the heterojunction diode shown in FIG. 4b while higher partial pressure ratios (about 9) resulted in the heterojunction diode shown in FIG. 4c.

Figure 5A:
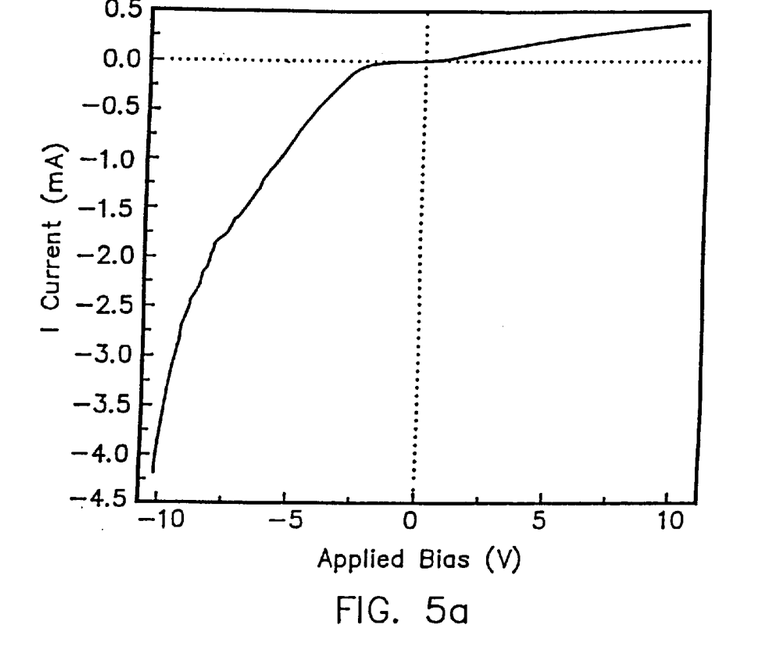
FIG. 5a shows a graph of I–V diode characteristics a nickel doped boron carbide heterojunction diode, with low nickel doping concentrations, according to the present invention.

The consequence of inclusion of nickelocene with orthocarborane as a source gas, the normally p-type boron carbide, relative to the n-type silicon, results in the formation of rectifying diodes with reverse bias. Thus the nickel doped boron carbide heterojunction diodes appears n-type relative to the lightly doped n-type silicon substrate. This is consistent with the fabrication of n-p heterojunctions diodes on p-type silicon, again by including nickelocene with the orthocarborane as an additional source gas, as seen in FIG. 5a.

Figure 4C:
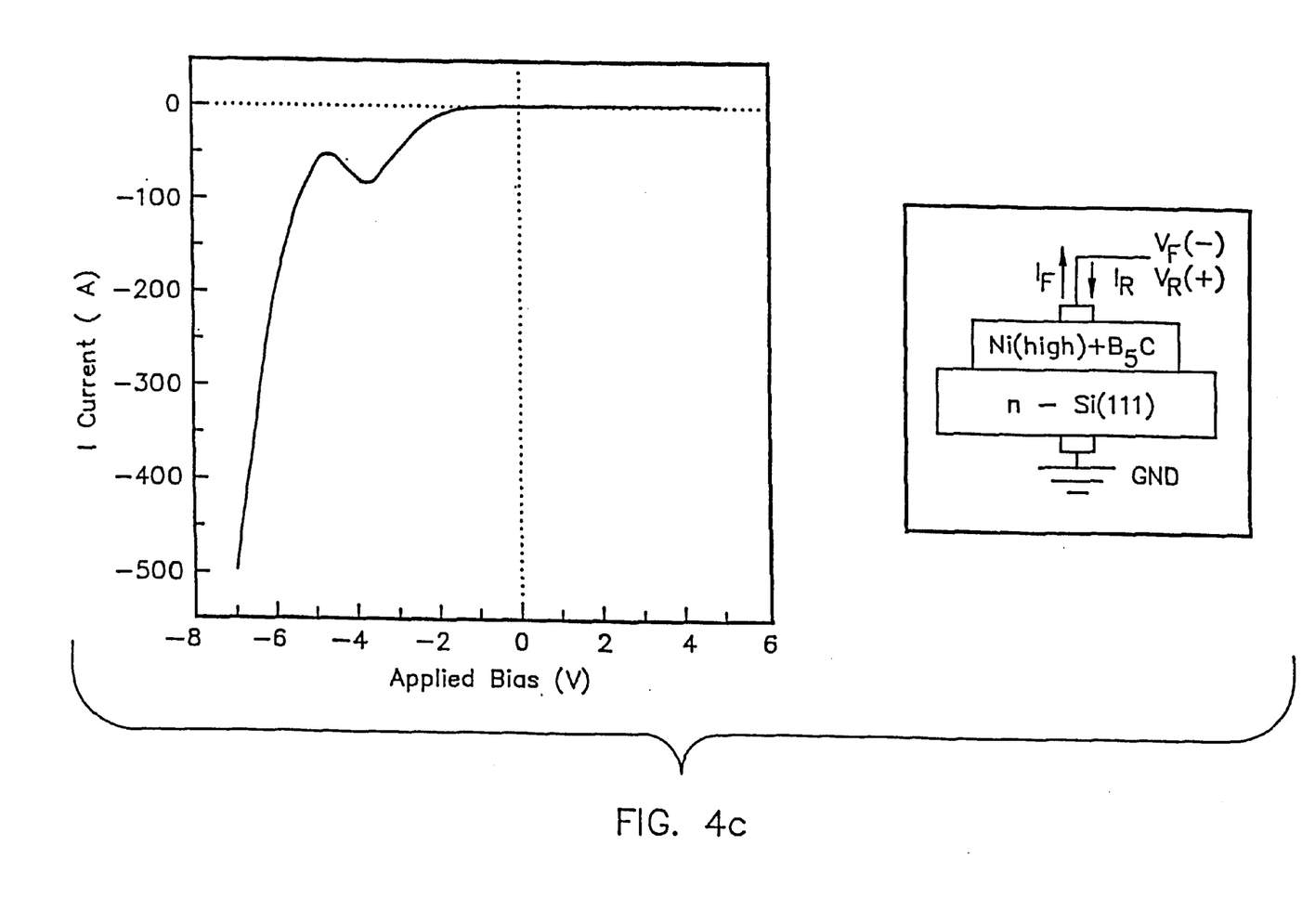
FIG. 4c shows the schematic cross-sectional geometry of the low nickel doped boron carbide/n-Si [1,1,1] heterojunction according to the present invention and a graph of diode I–V characteristics for the device.
Figure 5B:
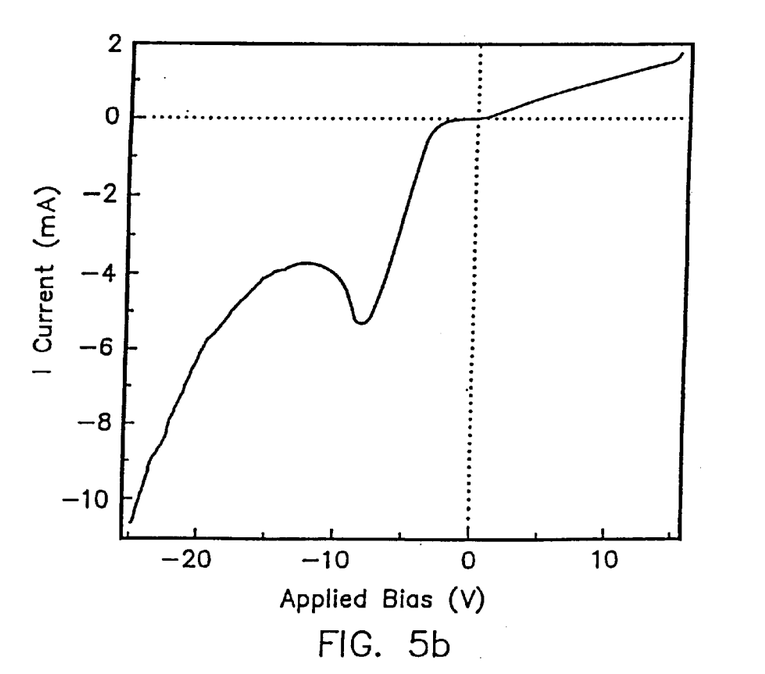
FIG. 5b shows a graph of I–V diode characteristics a nickel doped boron carbide heterojunction diode, with high nickel doping concentrations, according to the present invention.

With the higher nickel doping levels, a negative differential resistance or a valley current in the effective forward bias direction for diodes formed on both n-type silicon and p-type silicon substrates is apparent as seen in FIGS. 4c and 5b. This behavior is characteristic of a tunnel diode [24]. This is consistent with degenerative doping of a pinned state relative to the conduction band edge.

States pinned to one band edge have been proposed for boron carbide [22] and have been identified pinned to conduction band edge [25, 26]. The hump in the current occurs with at a larger bias voltage for the tunnel diodes fabricated on the p-type silicon. This consistent with the boron carbide thin film acting as an n-type layer and the formation of heterojunction n-p diodes. See also [27].

Figure 6:
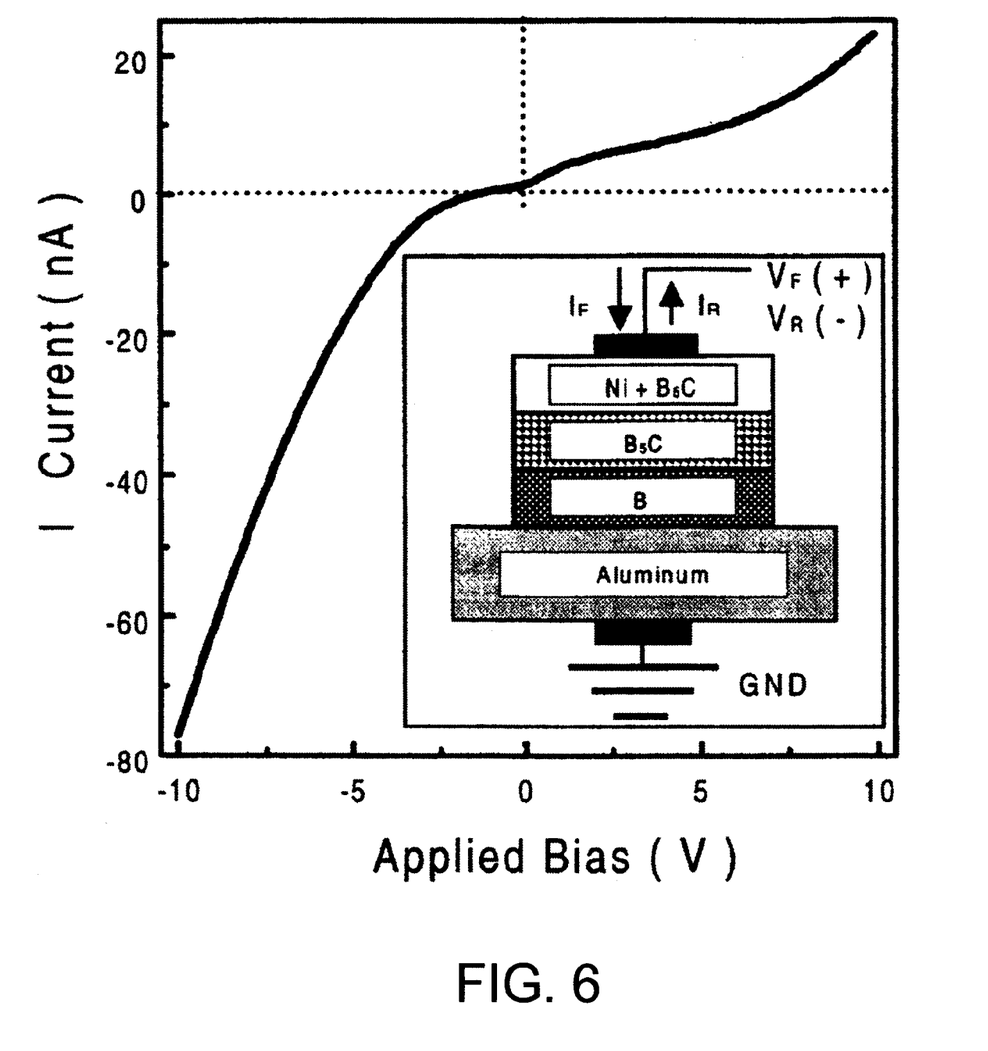
FIG. 6 is a graph of diode I–V characteristics of a boron rich semiconductor homojunction diode according to the present invention with the schematic cross-sectional geometry of the diode shown in the inset.

FIG. 6 shows the I–V characteristics and corresponding schematic diagram of a trilayer diode that has been fabricated from a PECVD nickel doped $B_5C$ layer deposited on an undoped PECVD $B_5C$ layer, with a semiconductor homojunction formed therebetween. The undoped PECVD $B_5C$ layer was deposited on a PECVD rhomboherdal boron layer placed on an aluminum substrate.

In summary, we have succeeded in the fabrication of boron carbide/boron junction field effect transistor on n-type [1,1,1] silicon. Our results suggest that with respect to the pure boron material, $B_5C$ acts as a p-type material. Both boron and $B_5C$ thin films were fabricated from single source borane cage molecules using PECVD. We have also fabricated a working $B_5C$/boron diode on aluminum. We have doped boron carbide and also fabricated a tunnel diode.

All references cited herein are expressly incorporated by reference in their entireties.

REFERENCES

[1] H. E. Robson, Ph.D. dissertation, University of Kansas (1959).

[2] S. Lee and P. A. Dowben, *J. Appl. Phys.* A58, 223 (1994).

[3] S. Lee, J. Mazurowski, G. Ramseyer and P. A. Dowben, *J. Appl. Phys.* 72, 4925 (1992).

[4] J. C. Lund, F. Olschner, F. Ahmed and K. S. Shah, Mat. *Sci. Soc. Symp. Proc.* 162, 601 (1990).

[5] Dongjin Byun, S. Hwang, P. A. Dowben, F. K. Perkins, F. Filips and N. J. Ianno, *Appl. Phys. Leff.* 64, 1968 (1994).

[6] Dongjin Byun, B. R. Spady, N. J. Ianno and P. A. Dowben, *Nanostructured Materials* 5, 465 (1995).

[7] J. Mazurowski, S. Baral-Tosh, G. Ramseyer, J. T. Spencer, Y.-G. Kim and P. A. Dowben, in *Plasma Processing and Synthesis of Materials, MRS Symposium Proceedings*, edited by D. Apelian and J. Szekely (MRS, Pittsburgh, Pa. 1991), vol.190, p.101; J. Mazurowski, S. Lee, G. Ramseyer and P. A. Dowben, in *Wide Band Gap Semiconductors MRS Symposium Proceedings*, edited by T. D. Moustakas, J. I. Pankove and Y. Hamakawa (MRS, Pittsburgh, Pa. 1992), vol.242, p.637.

[8] F. K. Perkins, R. A. Rosenberg, S. Lee and P. A. Dowben, *J. Appl. Phys.* 69, 4103 (1991).

[9] R. A. Rosenberg, F. K. Perkins, D. C. Mancini, G. R. Harp, B. F. Tonner, S. Lee and P.A. Dowben, *Appl. Phys. Lett.* 58, 607 (1991).

[10] A. P. Hitchcock, A. T. Wen, S. Lee, J. A. Glass, J. T. Spencer and P. A. Dowben, *J. Phys. Chem.* 97, 8171 (1993).

[11] S. Lee, J. Mazurowski, G. Ramseyer, and P. A. Dowben, *J. Appl. Phys.*, 72, 4925 (1992).

[12] S. Lee and P. A. Dowben, *J. Appl. Phys.* A58, 223 (1994); S. Lee, T. Ton, D. Zych and P. A. Dowben, Mater. *Res. Soc. Symp. Proc.* 283, 483 (1993).

[13] Seong-Don Hwang, Dongjin Byun, N. J. Ianno, P. A. Dowben, and H. R. Kim, *Appl. Phys. Lett.* 68(11), 1495 (1996).

[14] D. Byun, B. R. Spady, N. J. Ianno, and P. A. Dowben, *Nanostructured Mat..* 5, 465 (1995).

[15] D. Byun, S.-d. Hwang, P. A. Dowben, F. K. Perkins, F. Filips and N. J. Ianno, *Appl. Phys. Lett.* 64, 1968 (1994).

[16] D. N. Mcllroy, Jiandi Zhang, P. A. Dowben, P. Xu and D. Heskett, *Surface Science* 328, 47 (1995).

[17] D. N. Mcilroy, J. Zhang, P. A. Dowben and D. Heskett, *Mat. Sci. Eng.* (1996), in press.

[18] L. F. Warren, and M. F. Hawthorne, *J. Am. Chem. Soc.* 90, 4823 (1990); L. F. Warren, and M. F. Hawthorne, *J. Am. Chem. Soc.* 92, 1157 (1970); M. F. Hawthorne, D. C. Young, T. D. Andrews, D. V. Howe, R. L. Pillings, A. D. Pitts, M. Reintjes, L. F. Warren and P. A. Wegner, *J. Am. Chem. Soc.* 90, 879 (1968); K. Y. Callahan and M. F. Hawthorne, *Adv. Organometallic Chem.* 14, 145 (1976).

[19] K. Widder, D. Berner, A. Zibold, H. P. Geserich, M. Knupper, M. Kielwein, M. Buchgeister and J. Fink, *Europhys. Lett.* 30, 55 (1995); R. J. Cava, B. Batlogg, J.

J. Krajewski, W. F. Peck, T. Siegrist, R. M. Fleming, S. Carter, H. Takagi, R. J. Felder, R. B. van Dover and L. W. Rupp, *Physica C*, 226, 170 (1994); T. Siegrist, H. W. Zandbergen, R J. Cava, J. J. Krajewski and W. F. Peck, *Nature* 367, 254 (1994); R. J. Cava, H. Takagi, H. W. Zandbergen, J. J. Krajewski, W. F. Peck, T. Siegrist, B. Batlogg, R. B. van Dover, R. J. Felder, K. Mizuhashi, J. O. Lee, H. Eisaki and S. Uchida, *Nature* 367, 252 (1994); R. Nagarajan, C. Mazumdar, Z. Hossain, S. K. Dhar, K. V. Gopalakrishnan, L. C. Gupta, C. Godart, B. D. Padalia, and R. Vijayaraghavan, *Phys. Rev. Lett.* 72, 274 (1994).

[20] N. Kobayashi, Y. Kumashiro, P. Revesz, J. Li, and J. W. Mayer, Mat.er. *Res. Soc. Symp. Proc.* 162, 595 (1990).

[21] N. Kobayashi, Y. Kumashiro, P. Revesz, J. Li, and J. W. Mayer, *Appl. Phys. Lett.* 54, 1914 (1989).

[22] Y.-G. Kim, D. Byun, C. Hutchings, P. A. Dowben, H. Hejasi, and K. Schroeder, *J. Appl. Phys.* 70, 6062 (1991); G. T. Stauf, and P. A. Dowben, *Thin Solid Films* 156, L31 (1988); G. T. Stauf, D. C. Driscoll, P. A. Dowben, S. Barfuss, and M. Grade, *Thin Solid Films*, 153, 421 (1987).

[23] N. M. Boag and P. A. Dowben, *Metallized Plastics 4: Fundamental and Applied Aspects*, Edited by K. L. Mittal, Plenum Press, New York (1996); D. Zych, A. Patwa, S. S. Kher, J. T. Spencer, J. Kushneir, A. J. Goodby, N. M. Boag and P. A. Dowben, *J. Appl. Phys.* 76, 3684 (1994).

[24] T. P. Brody, *J. Appl. Phys.* 38, 2384 (1967); E. O. Kane, *J. Appl. Phys.* 32, 83 (1961); E. O. Kane, *Phys. Chem. Solids* 2,181 (1960); A. G. Chynoweth, W. L. Feldmann and R A. Logan, *Phys. Rev.* 121, 684 (1961); R A. Logan and A. G. Chynoweth, *Phys. Rev.* 131, 89 (1963), R. S. Claassen, *J. Appl. Phys.* 32, 2372 (1961); A. S. Epstein and J. F. Caldwell, *J. Appl. Phys.* 35, 3050 (1964); D. Meyerhofer, G. A. Brown and H. S. Sommers Jr., *Phys. Rev.* 126, 1329 (1962); R. M. Minton, and R. Glicksman, *Solid State Electron* 7, 491 (1964); J. Karlovsky, *Solid State Electron* 10, 1109 (1967).

[25] H. Werheit, U. Kuhlmann, M. Laux and T. Lundstrøm, *Phys. Stat. Sol.* 179, 489 (1993).

[26] H. Werheit, M. Laux, and U. Kuhlmann, *Phys. Stat. Sol.* 176, 415 (1993).

[27] Seong-Don Hwang, N. B. Remmes, P. A. Dowben, and D. N. McIlroy, *J. Vacuum Sci. & Tech.* B 14(4), 2957, 1996.

What is claimed is:

1. A heterojunction semiconductor device comprising a first layer of substrate material, said substrate material comprising a metal or semiconductor material; a second layer comprising elemental boron deposited on said first layer; and a third layer comprising boron carbide deposited on said second layer.

2. The heterojunction semiconductor device according to claim 1 wherein said first layer is selected from the group consisting of aluminum, silver, n-type silicon [1,1,1], and p-type Si [1,1,1].

3. The heterojunction semiconductor device according to claim 2 wherein said second layer is substantially pure boron.

4. The heterojunction semiconductor device according to claim 2 wherein the molar ratio of boron and carbon in said boron carbide is about 5.

5. The heterojunction semiconductor device according to claim 4 wherein said third layer comprises $B_5C$.

6. The heterojunction semiconductor device according to claim 5 wherein said first layer is selected from the group consisting of aluminum and n-type silicon [1,1,1].

7. The heterojunction semiconductor device according to claim 6 wherein said heterojunction semiconductor device is a diode.

8. The heterojunction semiconductor device according to claim 6 wherein said first layer is n-type silicon [1,1,1].

9. The heterojunction semiconductor device according to claim 8 wherein said heterojunction semiconductor device is a junction field effect transistor.

10. A heterojunction semiconductor device comprising a first layer of n-type silicon [1,1,1] and a second layer of boron carbide doped with nickel deposited on said first layer.

11. The heterojunction semiconductor device according to claim 10 wherein said second layer is formed by chemical vapor deposition of nickelocene and orthocarborane.

12. The heterojunction semiconductor device according to claim 11 wherein said second layer is formed by plasma enhanced chemical vapor deposition of nickelocene and orthocarborane and wherein the ratio of the partial pressure of nickelocene to the partial pressure of orthocarborane is from about 0.1 to about 0.2.

13. The heterojunction semiconductor device according to claim 11 wherein said second layer is formed by plasma enhanced chemical vapor deposition of nickelocene and orthocarborane and wherein the ratio of the partial pressure of nickelocene to the partial pressure of orthocarborane is less than 0.2.

14. The heterojunction semiconductor device according to claim 11 wherein said heterojunction semiconductor device is a diode.

15. The heterojunction semiconductor device according to claim 11 wherein the ratio of the partial pressure of nickelocene to the partial pressure of orthocarborane is greater than 0.2.

16. The heterojunction semiconductor device according to claim 15 wherein said heterojunction semiconductor device is a tunnel diode.

17. The heterojunction semiconductor device according to claim 11 wherein the ratio of the partial pressure of nickelocene to the partial pressure of orthocarborane is about 9.

18. A semiconductor device comprising a first layer of substrate material, said substrate material comprising a metal or semiconductor material; a second layer comprising elemental boron deposited on said first layer; a third layer comprising boron carbide deposited on said second layer; and a fourth layer comprising boron carbide doped with nickel.

19. The semiconductor device according to claim 18 wherein said substrate material comprises aluminum.

* * * * *